US006998153B2

(12) United States Patent
Chiang et al.

(10) Patent No.: US 6,998,153 B2
(45) Date of Patent: Feb. 14, 2006

(54) SUPPRESSION OF $NISI_2$ FORMATION IN A NICKEL SALICIDE PROCESS USING A PRE-SILICIDE NITROGEN PLASMA

(75) Inventors: Mei-Ling Chiang, San Jose, CA (US); Thai-Cheng Chua, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 251 days.

(21) Appl. No.: 10/354,215

(22) Filed: Jan. 27, 2003

(65) Prior Publication Data

US 2004/0144639 A1 Jul. 29, 2004

(51) Int. Cl.
*C23C 16/00* (2006.01)
*C23C 14/10* (2006.01)

(52) U.S. Cl. ............................ 427/255.11; 427/255.18; 427/255.27

(58) Field of Classification Search ........... 427/255.11, 427/255.18, 255.27; 438/682
See application file for complete search history.

(56) References Cited

U.S. PATENT DOCUMENTS

2002/0064918 A1 * 5/2002 Lee et al. .................. 438/300
2003/0157771 A1 * 8/2003 Luoh et al. ................ 438/287

* cited by examiner

*Primary Examiner*—Timothy Meeks
*Assistant Examiner*—Eric B. Fuller
(74) *Attorney, Agent, or Firm*—Patterson & Sheridan, LLP

(57) ABSTRACT

A method that includes placing a wafer within a process chamber, generating a nitrogen plasma that is remote from the process chamber, nitriding a surface of the wafer with the nitrogen plasma, depositing a nickel film over the nitrided silicon substrate surface, and annealing the nickel film to form NiSi.

12 Claims, 2 Drawing Sheets

200

SUPPRESSION OF $NISI_2$ FORMATION IN A NICKEL SALICIDE PROCESS USING A PRE-SILICIDE NITROGEN PLASMA

FIELD OF THE INVENTION

This invention in general relates to film deposition onto a substrate and in particular to a method for applying a layer of nickel salicide onto a wafer surface.

BACKGROUND OF THE INVENTION

There is a constant demand for placing more semiconductor devices on a given area to provide an increased density of devices on the semiconductor chip that are faster and consume less power. This requires a reduction in the line width dimensions for each device.

The self-aligned silicidation (salicide) technique has become an important part of ultra-high speed CMOS technologies. $TiSi_2$ is widely used as the silicide material. It has been found, however, that the sheet resistance of a Ti-salicided gate electrode increases significantly as the line width decreases. When producing line widths down to approximately 0.25 micron, titanium can be used. The titanium silicon (TiSi) can convert to $TiSi_2$ at 800 degrees C. and where $TiSi_2$ maintains a low resistivity.

To obtain smaller line widths down to 0.13 micron, cobalt can be used where the initially formed CoSi will convert to $CoSi_2$ at approximately 700 degrees C. with $CoSi_2$ also maintaining low resistivity. To reach line widths of 0.10 micron or smaller, the single crystal sizes of $TiSi_2$ and $CoSi_2$ are too large to be used. Nickel has been found to form smaller crystal sizes and to exhibit no such sheet resistance degradation at the smaller line widths. As a result, NiSi has potential as a suitable candidate to replace $TiSi_2$ and $CoSi_2$. for fabrication of sub-0.10 micron line widths.

After initially depositing NiSi onto silicon, the salicide process will convert the NiSi to nickel di-silicide ($NiSi_2$) when subjected to an intermediate temperature as low as 300 degrees C. with the $NiSi_2$ phase remaining up to 900 degrees C. While NiSi has a low resistivity similar to $TiSi_2$, $NiSi_2$ does not have such a low resistivity. As a result, the formation of $NiSi_2$ will increase sheet resistance of the salicided poly-Si gate and active regions.

SUMMARY OF THE INVENTION

A method for applying a nickel silicide layer to a silicon substrate using a pre-silicide $N_2$+ implant is disclosed. The formation of $N_2^+$ can be accomplished through the generation of a plasma with nitrogen doping occurring on the gate and active regions of the substrate prior to nickel deposition. In the evolution of the Ni/Si system at high temperatures, the incorporation of the pre-silicide $N_2$+ implant can delay the nucleation of $NiSi_2$ during a subsequent anneal process.

DETAILED DESCRIPTION OF THE INVENTION

A method of plasma nitridation to delay a phase transformation of an undesirable high resistivity nickel di-silicon ($NiSi_2$) phase to a higher silicidation temperature, thereby increasing the process window for a nickel salicide process in the CMOS process flow is disclosed.

Plasma nitridation can be used to implant a wafer silicon surface. In one embodiment, generating the plasma can be remotely accomplished, i.e. the plasma generation is decoupled from the process chamber. Decoupled plasma nitridation (DPN) is a method where a gas, such as, for example, nitrogen gas can be first converted to a plasma outside a process area such as, for example, a nitridation chamber. The decoupled plasma can include quasi-remote plasma generation, such as where a separate plasma formation chamber is attached to and opens into the process chamber. The plasma can then be directed into the nitridation chamber to flow over a surface of a single wafer to undergo nitridation. The resulting nitridation of the wafer surface can result in an ultra-shallow nitrogen doping of the silicon with reduced surface damage. Such nitrogen doping can be to a depth of up to approximately 50 Angstroms.

With the plasma generated remotely or quasi-remotely, DPN can allow for the use of lower process temperatures along with an ion-rich plasma that can be applied for a short duration. After nitridation, a thin-layer of nickel can be deposited. Annealing the nickel coating can initially convert the nickel to NiSi. As a result of the prior nitridation of the silicon surface, the formation of undesirable $NiSi_2$ from NiSi during the nickel anneal can be delayed up to anneal temperatures as high as 800 degrees C.

Figure 1:
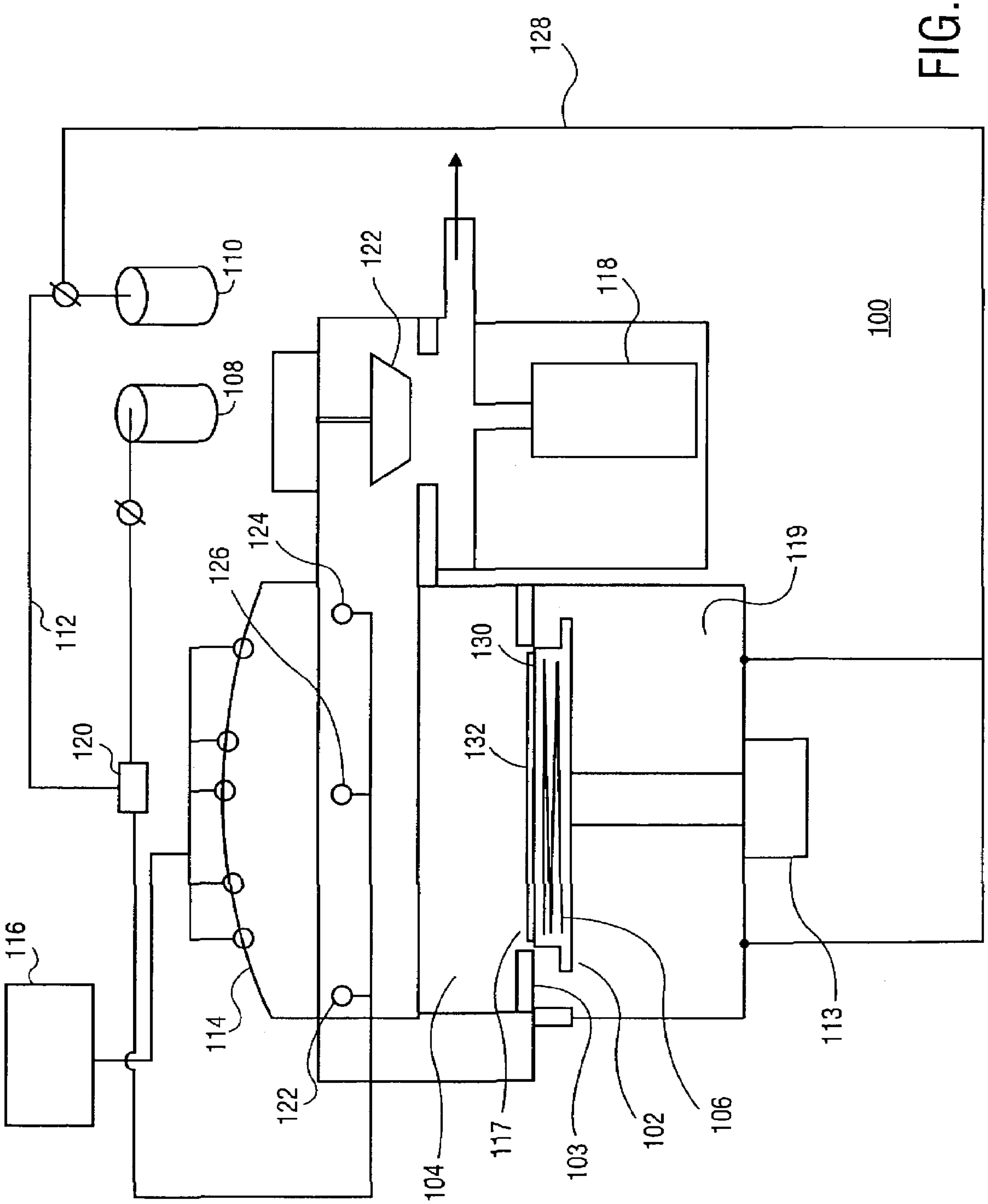
FIG. 1 is a cross-section of one embodiment of a decoupled plasma nitridation process chamber.

FIG. 1 is a cross-section of one embodiment of a process chamber that can apply a quasi-decoupled nitridation plasma. In one embodiment, a wafer holding chuck (chuck) 102 can be positioned within an interior 104 of the quasi-Decoupled Plasma Nitridation (DPN) process chamber 100. While a decoupled plasma nitridation process chamber is illustrated here, other process chambers may be used. An example of a suitable decoupled plasma nitridation (DPN) is described and illustrated in U.S. patent application Ser. No. 10/170,925 filed Jun. 12, 2002.

The wafer holding chuck 102 can be capable of being heated by such apparatus as, for example, resistive heating elements 106 that can be buried within the wafer holding chuck 102. Process gasses 108, such as, for example, nitrogen and inert gases 110 used for mixing with the process gas 108 and for purging, such as, for example, helium, neon, or argon 110, can be connected by plumbing 112 to an upper chamber 114 (dome) of the DPN process chamber 100. A manifold 120 can be connected to the plumbing 112 that is capable of injecting a smaller stream, i.e. volume, of nitrogen gas 108 into the inert gas 110 prior to entering the dome 114. The nitrogen 108 and/or purge gasses 110 can be injected into the dome 114 at several locations 122, 124, and 126 that can be symmetric about the dome 114. In one embodiment, the process chamber internal volume 104 can be approximately 24 liters and the DPN process chamber 100 can be capable of processing a wafer 117 that is 200 mm or greater in diameter.

Radio frequency (RF) energy can be generated that is capable of converting an inert gas 110, a process gas 108, or an inert/process gas 110/108 mix into a plasma (not shown) as the gas 110/108 or gas mix 108/110 flows into the dome 114. An inductively coupled RF source generator 116 can be electrically connected to transducers 115 on the dome 114 that are capable of applying RF energy within the dome 114 and, as a result, convert the nitrogen gas and/or inert gas(es) 108/110 to an ionic form, i.e. the plasma.

In one embodiment, the wafer 117 can be cooled to maintain a temperature. Plumbing 128 can connect the inert gas 110 to a bottom surface 130 of the DPN process chamber 100 to flow into an area 119 that may not undergo nitridation. The inert gas 110 can enter the area 119 at a cool temperature, such as, for example, ambient. Once in the area 119, the inert gas 110 can flow onto a bottom surface 130 of the wafer 117. A greater flow of the inert gas 110 to the wafer bottom surface 130 may provide a greater force to the wafer 117 than a flow of the gases 108/110 directed onto the top surface 132 of the wafer 117. To stabilize the wafer 117 onto the chuck 102, the wafer 117 can be electrostatically held onto the chuck 102 where the chuck 102 is electrically charged to act as a cathode, i.e. chucking. The electrostatic charge may be accomplished with an RF bias power source 113 applied to the chuck 102 that has a matched frequency, i.e. tuned to the RF power source 116 generating the plasma. Between a negative force existing within the nitrogen and/or inert gas 108/110 plasma and a positive force at the wafer holding chuck 102, a determination that an approximate 50 ohm load exists therein may characterize the plasma as stabilized.

The radio frequencies applied can be in the range of approximately 12.00–13.6 MHz using approximately between 400 and 2500 Watts. In one embodiment, the plasma RF frequency can be approximately 12.56 MHz using approximately 2000 Watts power and the biasing RF applied to the wafer holding chuck 102 can use approximately 500 Watts power at a frequency of approximately 13.56 MHz.

The DPN process chamber 100 can include a throttle valve 122 which can open to allow venting 120 of process gasses out of the chamber 100 that can be assisted by a pump such as, for example, a 2000 liter/sec turbo pump 118. The process chamber interior 104 can be lined with quartz (not shown) and a ring 103 can be placed around the chuck 102 and wafer 117 to reduce contamination.

Figure 2:
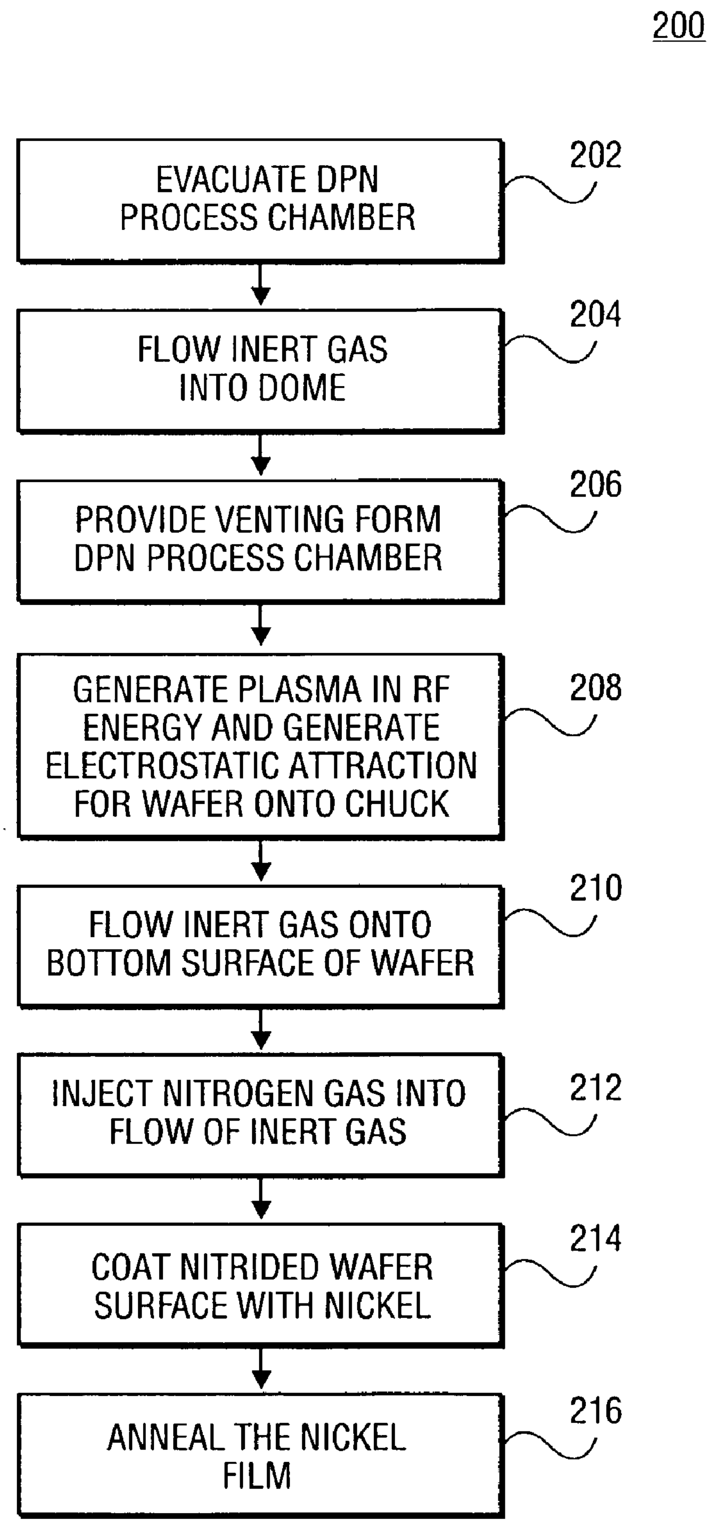
FIG. 2 is a flow diagram of one embodiment of a method for forming a nickel salicide using the decoupled plasma nitridation (DPN) process chamber.

FIG. 2 is a flow diagram of one embodiment of a method to suppress $NiSi_2$ formation during a nickel salicide process. The method (200) can begin with the evacuation of the internal volume of the process chamber using a vacuum, i.e. a lower pressure (operation 202). Next, an inert gas, such as, for example, helium, neon or argon gas can be injected into the upper chamber (dome) at an approximate flow rate of 400 sccm (standard cubic centimeter per minute) (operation 204). During processing, all gases can be vented from the process chamber at a rate to maintain a process chamber pressure of approximately in the range of 5–100 m Torr with 50 m Torr (milli-Torr) preferred. In one embodiment, venting can occur through a variable opening such as by using a throttle valve coupled with a turbo pump. (operation 206). Plasma generating RF energy can be applied to transducers on the process chamber dome and biasing RF energy (to maintain the wafer in position) can be applied to the wafer holding chuck (operation 208). Inert gas can be applied to the wafer bottom surface to cool the wafer and maintain it at a selected temperature. In one embodiment, the cooling inert gas can be applied to the wafer bottom surface at ambient temperature from entrance ports positioned at the bottom of the process chamber (operation 210). After ionization of the inert gas is stabilized, nitridation can begin. With nitridation, ionization can continue where nitrogen gas ($N_2$) augments the inert gas stream with an $N_2$ flow rate that is a smaller percentage of nitrogen gas to inert gas. The $N_2$ gas can be injected into the inert gas upstream of the transition to plasma. In one embodiment the flow rate of nitrogen gas can be approximately 20 sccm mixed with inert gas flowing at a rate of 400 sccm. If the flow rate of the inert gas is other than 400 sccm, the flow rate of nitrogen gas can be set so that a percentage in the range of up to 95% nitrogen by flow rate can be used, however a range of approximately 5–20% nitrogen by flow rate to the flow rate of the helium gas is preferred. A cycle time for nitridation of the wafer can be between approximately 10 seconds–3 minutes where the current for ionization can be applied for approximately 30 seconds (operation 212).

In one embodiment, through out the nitridation process, the process chamber temperature can remain at approximately ambient since the process gasses injected can be at approximately in the range of 25–80° C. and the inert gas directed into the lower area of the process chamber is capable of removing the heat from the chuck.

In one embodiment, a film of nickel can be deposited onto the wafer after the nitridation process. The nickel film can be deposited by a process and method well known in the industry such as Physical Vapor Deposition (PVD). In one embodiment, the wafer is transferred to a separate PVD chamber, such as, for example, Applied Material's (Santa Clara, Calif.) Endura PVD chamber The PVD process chamber can be pumped down to the desired vacuum pressure. A negative charge is maintained to the cathode material, i.e. the PVD chuck and a negative bias is applied to the wafer. The nickel deposited can arrive onto the wafer at a high energy level and will travel along the wafer surface until it reaches a preferred nucleation site. The continuous bombardment of ions from the source sputters the depositing nickel material so that large edge build-ups that are common with electroplated coatings do not occur. This bombardment is controlled carefully so as not to overheat the wafer. Due to the higher energy levels of the ions arriving at the surface of the wafer the adhesion is substantially better than that provided by electroplating. The deposition is continued until the desired coating thickness, such as, for example, up to 200 Angstroms is achieved and the wafer is removed from the chamber (operation 214).

The wafer can then be transferred to a Rapid Thermal Processing (RTP) chamber for annealing. Annealing can convert the nickel film to nickel silicide and where this Ni-salicide process can be carried out at 600 degrees C. to 900 degrees C. in an inert gas (operation 216).

The method can result in a stable Ni-salicide process having a widened salicide processing temperature window. The salicided poly-Si gate and active regions of different line widths can show improved thermal stability with low sheet resistance when annealed at temperatures of up to 900 degrees C. The electrical results of the nitrogen implanted Ni-salicided devices can show higher drive current and lower junction leakage as compared to devices with no $N_2^+$ implant. The Ultra-shallow nitrogen doping with reduced surface damage (as compared with implantation) of the silicon can reduce junction leakage in devices and where the process provides for precise nitrogen dose control.

What is claimed is:

1. A method comprising:
 - placing a silicon wafer within a process chamber;
 - generating a nitrogen plasma decoupled from the process chamber;
 - nitriding a surface of the silicon wafer with the nitrogen plasma;
 - depositing a nickel film over the nitrided silicon wafer surface;
 - annealing the nickel film to form NiSi,
 - wherein the plasma is generated by an RF source that is at a power in the range of approximately 900–2000 Watts; and
 - generating an inert gas plasma that precedes generating the nitrogen plasma; and wherein nitrogen gas is mixed with an inert gas upstream of plasma formation after the inert gas has stabilized as a plasma.

2. The method of claim 1, wherein decoupled plasma generation is accomplished quasi-remotely.

3. The method of claim 1, wherein decoupled plasma generation is accomplished remotely.

4. The method of claim 1, wherein the plasma is generated by an RF source.

5. The method of claim 1, wherein annealing is performed at a temperature in the range of approximately 350–550° C.

6. The method of claim 1, wherein annealing is performed at a temperature of approximately 400° C.

7. The method of claim 1, wherein the nickel film is deposited to a thickness of approximately 200 Angstroms.

8. The method of claim 1, wherein the nitridation penetrates the wafer surface to a depth of up to approximately 50 Angstroms.

9. The method of claim 1, wherein the nitrogen plasma further includes an inert gas.

10. The method of claim 9, wherein the inert gas is chosen from the group consisting of helium, argon, and neon.

11. A method comprising:

flowing an inert gas;

generating an inert gas plasma by applying RF energy to the inert gas that is decoupled from a process chamber;

flowing the inert plasma onto a wafer positioned within the process chamber;

stabilizing the inert gas plasma;

injecting nitrogen gas into the flow of inert gas;

cooling by applying inert gas to a bottom surface of the wafer;

depositing a nickel coating onto the wafer; and forming nickel silicide by annealing the nickel coating.

12. The method of claim 11, further comprising maintaining the wafer on a wafer holding chuck with electrostatic forces.

* * * * *